US005725996A

United States Patent [19]
Houlihan et al.

[11] Patent Number: 5,725,996
[45] Date of Patent: Mar. 10, 1998

[54] ENERGY SENSITIVE COMPOSITION AND A PROCESS FOR DEVICE FABRICATION USING THIS COMPOSITION

[75] Inventors: Francis Michael Houlihan, Millington; Howard Edan Katz, Summit; Marcia Lea Schilling, Basking Ridge, all of N.J.

[73] Assignee: Lucent Technologies Inc., Murray Hill, N.J.

[21] Appl. No.: 731,865

[22] Filed: Oct. 22, 1996

Related U.S. Application Data

[63] Continuation of Ser. No. 154,202, Nov. 17, 1993, abandoned.

[51] Int. Cl.$^6$ ........................................................ G03F 7/00
[52] U.S. Cl. ........................ 430/322; 430/324; 430/281
[58] Field of Search ............................. 430/270.1, 311, 430/313, 322, 323, 324, 325, 281

[56] References Cited

U.S. PATENT DOCUMENTS

| | | | |
|---|---|---|---|
| 4,487,859 | 11/1984 | Martino | 526/274 |
| 4,491,628 | 1/1985 | Ito et al. | 430/176 |
| 4,839,253 | 6/1989 | Demmer et al. | 430/190 |
| 4,939,070 | 7/1990 | Brunsvold et al. | 430/312 |
| 4,996,136 | 2/1991 | Houlihan et al. | 430/313 |
| 5,200,544 | 4/1993 | Houlihan et al. | 558/44 |

FOREIGN PATENT DOCUMENTS

| | | |
|---|---|---|
| 0 301 101 | 2/1989 | European Pat. Off. . |
| 0 416 829 A2 | 3/1991 | European Pat. Off. . |
| 0 501 243 A1 | 9/1991 | European Pat. Off. . |

OTHER PUBLICATIONS

"New Photochemically Labile Protecting Group for Phosphates", by T. Furato et al., *Chemistry Letters*, No. 7, pp. 1179–1182, (1993).

T. H. Lowry, et al., *Mechanism and Theory in Organic Chemistry*, pp. 226–232 (1976).

G. Cao et al., "Layered Metal Phosphates and Phosphonates: From Crystals to Monolayers" *Acc. Chem Res.*, 25(9): 420–237 (1992).

T. Furuta, et al., "New Photochemically Labile Protecting Group for Phosphates," *Chemistry Letters*, pp. 1179–1182 (1993).

M. J. Sundell et al., "Synthesis and Use as a Catalyst Support of Porous Polystyrene with Bis(phosphonic acid)–Fuctionalized," *Chem. Mater.*, vol. 5, No. 3, pp. 372–376 (1993).

J. March, *Advanced Organic Chemistry—Reactions, Mechanisms, and Structure*, 3rd Ed., pp. 142–149, John Wiley & Sons, Inc., New York (1985).

D. Letourneur et al., "Synthesis and Characterization of Phosphorylated Polystyrene Derivatives for Use in Chromatography: DNA–like and Phosphlipid–like Behavior," *Journal of Polymer Science: Part A, Polymer Chemistry*, vol. 29, 1367–1377, John Wiley & Sons, Inc., New York (1991).

*Primary Examiner*—Kathleen Duda
*Attorney, Agent, or Firm*—Richard J. Botos

[57] ABSTRACT

A novel resist composition is disclosed. The resist composition is used in a lithographic process for device fabrication. The resist composition contains a polymer with phosphorus ester moieties. These moieties make the resist composition suitable for use in a variety of lithographic processes for fabricating integrated circuits.

7 Claims, No Drawings

ENERGY SENSITIVE COMPOSITION AND A PROCESS FOR DEVICE FABRICATION USING THIS COMPOSITION

This application is a continuation of application Ser. No. 08/154,202, filed on Nov. 17, 1993, now abandoned.

BACKGROUND OF THE INVENTION

1. Field of the Invention

The present invention is directed to polymeric energy sensitive materials and a process for device fabrication that utilizes these materials.

2. Art Background

Lithographic processes are commonly used to fabricate integrated circuits and other devices. In lithographic processes, a latent image is introduced into an energy sensitive resist material ("resist"). The incident energy is introduced into the resist in a patternwise manner, the pattern corresponding to the desired image. The incident energy induces a chemical change in the resist. Frequently, this chemical change is augmented by a post-exposure bake (PEB). This chemical change does not significantly occur in the portions of the resist that are not exposed to energy. The chemical difference between the unexposed and the exposed areas of the resist, known as the chemical contrast, is then exploited to develop the latent image introduced into the resist by the incident energy.

The energy-induced chemical contrast between the unexposed region and the exposed region of a resist material is enhanced by a process referred to as chemical amplification. In chemical amplification, the effect of exposing the resist to energy is chemically enhanced. Examples of chemically amplified resists are disclosed in U.S. Pat. No. 5,200,544 to Houlihan et al. and U.S. Pat. No. 4,491,628 to Frechet et al.

Chemically amplified resists frequently use moieties which are cleaved from the resist in the presence of light (photolabile) or acid (acid labile) as a mechanism for introducing the desired contrast into the resist. These moieties, when pendant to certain functional groups, "protect" the functional groups. "Protect" means that when the moieties are attached to the functional groups, the resist does not exhibit the activity associated with these functional groups. When the moieties are cleaved from the resist, the functional groups are unblocked and the resist then exhibits the activity associated with the functional groups.

It is advantageous if the chemical contrast is introduced without extreme changes in the resist volume. For example, cleavage and volatilization of protecting groups results in shrinkage of the resist because of the mass loss. This shrinkage will cause distortion of pattern features and loss of resolution. Although a certain amount of shrinkage and distortion is tolerated, it is advantageous if the resist shrinks less than 20% by volume during deprotection and subsequent processing. Therefore, polymers that shrink less during deprotection are desired.

A resist material that is used in a variety of lithographic processes is also advantageous. Many mechanisms are used to develop a pattern from the image introduced into the resist via the patternwise exposure and then transfer the pattern into the substrate. In many instances a pattern is solution-developed and is subsequently transferred into a substrate which underlies the resist. The pattern is transferred using solution etches or plasma etches depending on the process. The processes used to develop a pattern from the image and to use that pattern for device fabrication also depend upon a variety of factors, including the desired characteristics of the device being fabricated and the mechanism by which the device is fabricated. Frequently, different resist polymers are used in different processes because the polymers have properties that are particularly suited for certain process conditions. A polymer that is suited to incorporation in a variety of resist materials which are used in a variety of lithographic processes offers certain processing advantages.

SUMMARY OF THE INVENTION

A resist composition that contains a polymer with phosphorus ester moieties is disclosed. The polymer is the polymerization product of at least one phosphorus ester monomer, that monomer being either a phosphate ester or a phosphonate ester. These phosphorus ester monomers have the following general structure:

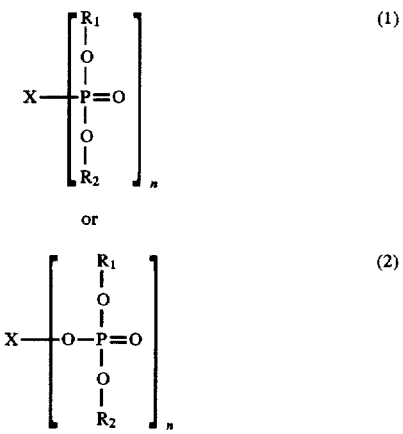

The monomers designated by (1) are the phosphonate ester monomers and the designated by (2) are the phosphate ester monomers. In the above formula, n is at least one. Typically, there will be one phosphonate or phosphate moiety per monomer (X). However, monomers with more than one such moiety pendant thereto are contemplated.

$R_1$ is a moiety such that the $O-R_1$ bond breaks in the presence of acid to form a carbonium ion that is sufficiently stabilized to allow subsequent elimination of an available $\alpha$-hydrogen (e.g., tert(t)-butyl, isopropyl). $R_2$ is an organic group that is the same or different than $R_1$. $R_2$ is not hydrogen. X is a polymerizable moiety. It is advantageous if such moieties contain ethylenic unsaturation. The monomers are suitable for polymerization either by themselves or with other monomers to form a resist polymer.

The above monomers are polymerized to form resist polymers using conventional techniques. The resist polymers are then combined with an energy sensitive material, such as a photoacid generator, to form a resist material.

The resist material is used in a lithographic process for device fabrication. The resist material is deposited on a substrate and patternwise exposed to radiation. The radiation causes the photoacid generator (PAG) to generate an acidic moiety. The resist material is then subjected to a post exposure bake, thereby converting a substantial portion of the phosphorus ester moieties on the resist polymer in the exposed region to phosphorus acid moieties. These phosphorus acid moieties are chemically distinct from the phosphorus ester moieties, which are more prevalent in the unexposed region of the resist. This contrast is then exploited to either develop a pattern from the image in the resist or to otherwise introduce a selectivity between the unexposed and exposed regions of the resist material, which pattern or selectivity is further exploited to define areas of the device.

DETAILED DESCRIPTION

The resist composition of the present invention is used in a variety of lithographic applications. The resist compositions contain energy-sensitive polymers that are applied onto a substrate. Exposing certain portions of the resist material to energy induces a chemical change in those exposed portions of the resist. The chemical difference between the exposed areas of the resist and the unexposed areas of the resist is then exploited to develop the image into a pattern. The pattern is then used in subsequent processing to fabricate a device. In certain applications the pattern is transferred into a substrate underlying the resist material.

In the resist composition of the present invention, certain phosphorus ester, e.g., phosphate ester or phosphonate ester, groups are incorporated in the resist polymer. When the resist is patternwise exposed to radiation, the incident energy causes certain changes in the resist. These changes, either directly or indirectly, enable the phosphorus ester groups in the exposed resist to convert into phosphorus acids. This chemical change renders the exposed region of the resist chemically distinct from the region of the resist that is not exposed to radiation. This chemical distinctness is then exploited to develop a pattern in the resist.

The resist polymers of the present invention are the polymerization product of phosphorus ester monomers with the general structure:

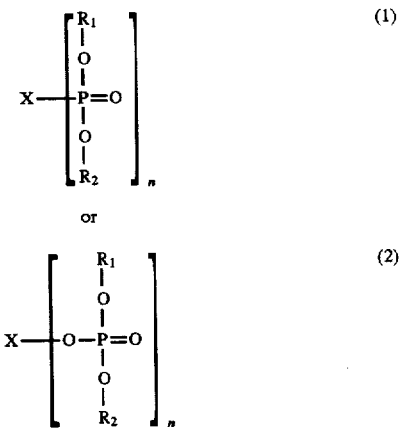

The monomer designated by (1) is a phosphonate ester and the monomer designated by (2) is a phosphate ester. In the above formula n is at least one. Typically, there will be one phosphonate or phosphate ester moiety on each monomer, however, monomers with more than one such moiety thereon are contemplated.

Examples of these phosphate ester or phosphonate ester groups include acid labile esters of phosphonic and phosphoric acids. These groups contain at least one organic substituent ($R_1$) which is linked to the phosphorus atom in the group by an oxygen atom. $R_1$ is a moiety such that $O—R_1$ bond breaks in the presence of acid to form a carbonium ion that is sufficiently stabilized to allow subsequent elimination of an available α-hydrogen. These organic substituent groups ($R_1$) are typically alkyl, substituted alkyl or aryl alkyl. Examples of the organic substituent are t-butyl and isopropyl. These groups are used in chemical amplification schemes as discussed in U.S. Pat. No. 4,939,070 to Brunsvold et al., the teachings of which are incorporated by reference. Typically, the bond between the oxygen atom and the organic substituent is sufficiently strong such that these bonds are not cleaved in significant numbers when the polymers are exposed to temperatures of less than 90° C. for less than about one minute. In the presence of acid, however, significantly more of these bonds are cleaved at a lower temperature in a comparable time interval.

In the above formula, $R_2$, is the same or different as $R_1$. If different, $R_2$, is any suitable substituent. It is advantageous if $R_2$ is not hydrogen (H) nor any moiety which would adversely affect the ability of the monomer to polymerize. It is also advantageous if $R_2$ contains fewer than 10 carbon atoms, so that $R_2$ does not significantly reduce the polarity of the resulting polymer.

The monomer X with the phosphorus ester moiety or moieties pendant thereto is any monomer that is suitable for polymerization with the same or different monomers to form a resist polymer. Such monomers are known to those skilled in the art. Typically, such monomers contain ethylenic unsaturation. Examples of such monomers include vinyl monomers, vinyl phenyl monomers and vinyl benzyl monomers. One skilled in the art will recognize that it is possible to synthesize many different polymerizable monomers with phosphorus ester moieties and that the polymers of the present invention are not limited to the polymerization products of the monomers specifically enumerated herein.

Specific examples of suitable phosphorus ester monomers include vinylbenzylphosphonic acid diesters and vinylphenyl dialkyl phosphoric acid triesters. The polymers are either homopolymers of these phosphate ester or phosphonate ester monomers or copolymers of these monomers along with other monomers. Copolymer, as used herein, means the polymerization product of two or more different monomers.

Monomers contemplated as copolymerizable with the phosphate ester or phosphonate ester monomers specifically disclosed herein are those commonly used to prepare resist polymers. Examples of these monomers include styrene and its derivatives, N-methyl maleimide and its derivatives and $SO_2$. Polymers are synthesized from these monomers under conditions used to synthesize analogous styrene polymers. These conditions are disclosed in U.S. Pat. No. 4,996,136 to Houlihan et al., which is incorporated by reference herein. One skilled in the art will recognize that there are a number of different monomers which will copolymerize with the phosphorus ester monomers to provide a resist polymer with the desired properties. It is contemplated that a resist polymer with adequate contrast will result if there is at least one phosphorus ester moiety on one of about every six monomeric units in the set of monomers that are incorporated in the resist polymer.

The particular substituent ($R_1$) selected will depend upon the characteristics that the resist polymer is desired to possess. For example, if the polymer is desired to deprotect at a temperature of about 150° C. or higher, t-butyl groups are selected as the organic substituents. The t-butyl group is removed from a polymer such as poly(di-t-butyl vinylbenzyl phosphonate) at temperatures above about 180° C. In the presence of acid, the temperature at which the t-butyl group is removed from this polymer is about 50° C. less. If the polymer is desired to deprotect at a temperature of about 170° C. or higher, isopropyl groups are selected as the organic substituents. Since isopropyl groups form a stronger bond with oxygen than t-butyl groups, stronger acids and/or higher temperatures are necessary to cleave these groups from the polymer. For example, the isopropyl group is removed from poly(di-isopropyl vinylbenzyl phosphonate) at a temperature of about 260° C. The isopropyl group is removed from the polymer at a temperature of about 170° C. in the presence of acid.

Additional organic protecting substituents ($R_1$) with reactivities between or comparable to the reactivities of t-butyl groups and isopropyl groups are also contemplated. Examples of such substituents are 2-butyl groups and 1-arylethyl groups. Relative reactivities of such substituents correlate with the susceptibilities of molecules with such substituents to undergo solvolysis and elimination reactions via substituent cation intermediates. Such relative reactivities are described in Lowry, T., et al., *Mechanism and Theory in Organic Chemistry*, pp. 226–232 (1976) which is incorporated by reference herein. It is advantageous if the substituent $R_1$ has at least one hydrogen atom on the carbon adjacent to the carbon attached to the oxygen atom of the phosphate or phosphonate group. This enables the substituent to be eliminated from the polymer as an alkene. However, it is possible that the substituent is eliminated from the polymer as an alkene by some other mechanism, such as, for example, rearrangement.

Numerous lithographic processes which exploit the phosphonate or phosphate functionality of the polymers of the present invention are contemplated by the present invention. In these processes, the resist polymer is combined with a PAG to form a resist material. The resist material is then applied onto a substrate and patternwise exposed to radiation, which introduces a latent image into the resist material. The PAG generates acid when it is exposed to radiation. Thus, the PAG generates a significant amount of acid only in the exposed portion of the resist. The protective groups ($R_1$ and, in certain instances $R_2$) are cleaved from the phosphate or phosphonate groups by the acid so generated. As mentioned previously, the cleavage or deprotection is accelerated by a PEB step. Thus, after PEB, the polymer in the exposed region contains significantly more phosphorus acid groups than the polymer in the unexposed region. This disparity in the number of these groups between the unexposed and exposed region is then exploited to utilize the image introduced into the resist material in subsequent processing.

For example, in a resist containing poly(di-t-butyl vinylbenzylphosphonate), when the resist is exposed to radiation in the presence of a PAG and then subjected to a PEB, the polymer in the exposed regions will have the t-butyl groups cleaved therefrom, providing a polymer with phosphonic acid groups. The polymer in the unexposed resist will remain predominantly poly(di-t-butyl vinylbenzylphosphonate), which has its phosphonic acid groups protected by t-butyl.

The contrast between the unexposed and exposed areas of the resist is due to the great difference in acidity between the phosphorus acid moieties in the exposed areas and the phosphonate ester moieties in the unexposed areas. For example, the ester poly(di-t-butyl vinylbenzylphosphonate) is significantly less soluble in an aqueous base solution than the acid, poly(vinylbenzylphosphonic acid). Therefore, the exposed portions of the polymer, after PEB, will dissolve in a solution of aqueous base, but the unexposed areas of the resist, i.e., the areas in which the phosphonate ester remains, will not dissolve. Thus, the unexposed area of the resist remains on the substrate.

The resist polymers of the present invention are contemplated as useful in a variety of lithographic processes. For example, the resist polymers of the present invention are incorporated into a resist material that will be used in 248 or 193 nm lithography, and X-ray or electron-beam lithography.

For example, a resist material that contains the resist polymers of the present invention will have many useful properties when used as resist material in deep ultraviolet photolithography. These resist materials will typically have a sensitivity of less than 100 mJ/cm$^2$, a contrast of greater than 5, an optical density of less than 0.4/µm, and a glass transition temperature that is greater than 140° C. Also, it is contemplated that the resist materials of the present invention lose less than 20 percent of their volume upon deprotection. The resist materials will have a sensitivity of about 20 mJ/cm$^2$ or less, a contrast of about 7 to about 10 and an optical density of about 0.2/µm under certain conditions. It is particularly advantageous if the resist materials of the present invention lose about 15 percent or less of their volume upon deprotection and subsequent baking steps.

It is contemplated that the phosphonate or phosphate functionality will also be used as a mechanism to introduce an etch selectivity into a resist. The phosphorus acid functionality has a strong tendency to bind to refractory materials. This tendency is described in Cao, G., et al., "Layered Metal Phosphates and Phosphonates: From Crystals to Monolayers," *Acc. Chem. Res.*, 25, (9): 420–427 (1992) which is incorporated by reference herein.

Refractory materials are extremely etch resistant. Therefore, if refractory materials are bound preferentially on one region of the resist, that region will be much more etch resistant than the other region. This etch selectivity is then exploited for pattern transfer in the context of a lithographic process. The deprotected phosphorous acid groups have a much stronger tendency to bind to refractory material than the protected phosphonate or phosphate groups. Therefore, etch selectivity is introduced into the resist by the deprotection mechanisms of the present invention. It is also contemplated that the tendency of deprotected phosphorus acid groups to bind to metal will be used to selectively bind a conducting metal on a certain portion of the resist material to form conducting lines or pads on the resist material. The conducting metal is deposited in the configuration necessary to form the desired circuit.

For example, a resist material is prepared and applied onto a substrate as described previously. The resist material is then patternwise exposed to radiation and subjected to a PEB. This provides for more phosphorus acid groups in the exposed portion of the resist material than the unexposed portion of the resist material. An etch selectivity between the exposed and unexposed portions of the resist is introduced by binding the refractory material to the portions of the resist which contains a substantially greater number of deprotected phosphorus acid groups. In many instances, this etch selectivity will be enhanced by successive applications of refractory material, alternated by the application of a solution containing a reagent which will serve to link refractory atoms together, thereby allowing multiple atomic layers of refractory material to be deposited on the exposed area of the resist. Pyrophosphoric acid is an example of a reagent that performs this function. The pyrophosphopric acid provides pyrophosphate ions which act as a link to bind the refractory material from successive applications together. Such a process is disclosed in a copending patent application, Katz-Taylor 5–27, which is filed concurrently with this application and is incorporated by reference into this disclosure.

Examples of refractory materials include zirconium and nickel. Zirconium is introduced onto the surface of the resist in a solution such as zirconium oxychloride. Nickel is introduced onto the resist using a standard electroless metal plating process.

In another embodiment, a dye is selectively introduced into or onto either the deprotected or protected regions of a polymer film due to the different chemical properties in each region. One example of a suitable dye is thionin, although one skilled in the art will recognize many other dyes are also suitable. It is contemplated that this mechanism is used to introduce a colored region in a film. The colored region corresponds to the latent image of a pattern introduced into the resist using conventional lithographic techniques. The films into which these colored regions are introduced are used in applications such as colored filters for displays, including liquid crystal displays.

It is advantageous if those polymers that are to be used as a mechanism for introducing etch or color selectivity into a resist polymer are synthesized primarily from the phosphorus-containing monomers described above. The purpose of this synthesis is to maximize the number of phosphonate or phosphate groups on the polymer which in turn, will maximize the amount of refractory material or the amount of dye incorporated onto the resist film. However, it is contemplated that the amount of phophosphorus-containing and other monomers that are used to synthesize a particular resist polymer is largely a matter of design choice. One skilled in the an will recognize that a number of different monomers are suited for copolymerization with the phosphorus-containing monomers described herein, and that these monomers provide particular advantages for particular applications.

One skilled in the an will appreciate that the principles described herein are susceptible to broad application. The following examples are provided to illustrate the present invention. The claims are not to be construed as limited to these examples.

EXAMPLE 1

PREPARATION OF AN ALKYL ESTER OF A PHOSPHORUS ACID

Freshly distilled di-t-butylphosphite (40 g, 0.2 mol) and di-isopropylphosphite (34 g, 0.2 mol) were dissolved separately, each in toluene (40 mL) under a nitrogen atmosphere and cooled to 0° C. in an ice bath. Sodium hydride (7.2 g, 60% in mineral oil, 0.18 mol) was added portionwise over 30 minutes to each of the cold toluene solutions. The solutions were stirred under nitrogen overnight and allowed to warm gradually to room temperature. Vinylbenzyl chloride (20 g; 0.12 mol) was added to each solution, which were then heated to 80° C. and stirred for three days (for t-butyl) or four hours (for isopropyl) under a nitrogen atmosphere.

A sample of each solution was subjected to NMR, which indicated that each reaction was more than 95 percent complete. The solutions were then cooled to room temperature, and were then washed twice with 50 mL of saturated sodium bicarbonate, and then with 50 mL of water. The toluene layer in each solution was separated and dried over anhydrous sodium sulfate. The toluene was removed from each solution using a rotary evaporator and the remaining oil pumped under vacuum (0.1 mm Hg) at 50° C. to remove excess phosphite. NMR showed the products to be pure di-t-butyl vinylbenzylphosphonate and pure di-isopropyl vinylbenzylphosphonate.

EXAMPLE 2

POLYMERIZATION OF AN ALKYL ESTER OF A PHOSPHORUS ACID

Di-t-butyl vinylbenzylphosphonate (7 g, 0.023 mol), prepared as described in Example 1, was dissolve in toluene (100 mL). Nitrogen was bubbled through the solution for 15 minutes to deoxygenate the solution. A photoinitiator, 2,2'-azobis-2-methylpropionitrile, (AIBN, 150 mg) was added to the solution and the temperature of the solution was then increased to 80° C. The solution was stirred under nitrogen for 16 hours. The toluene solution was cooled to room temperature and was then added dropwise to vigorously stirred hexane (600 mL) to precipitate the polymer. The polymer was reprecipitated twice by dissolving in toluene and precipitating in hexane. Five grams of homopolymer were collected.

EXAMPLE 3

AN ALTERNATE METHOD FOR PREPARING AN ALKYL ESTER OF A PHOSPHORUS ACID

Poly(4-hydroxystyrene) (1 g, 8.3 mmol) was treated with 2.9 g (12 mmol) of di-t-butyl diethylphosphoramidite and 0.82 g (12 mmol) of tetrazole in 50 mL of anhydrous tetrahydrofuran forming poly(di-t-butyl vinylphenylphosphite). After 3 hours, the mixture was cooled to −45° C. and meta-chloroperbenzoic acid (2.4 g; 14 mmol) was then added to the solution, forming poly(di-t-butyl vinylphenylphosphate). The mixture was allowed to warm to room temperature, and the polymer was precipitated from aqueous sodium sulfite (250 mL), redissolved in acetone (25 mL), and reprecipitated from water (125 mL). Under thermal gravimetric analysis, the polymer lost 40% of its weight at 120° C. under an argon atmosphere. The theoretical weight loss that results from cleaving two t-butyl groups from a di-t-butylvinylphenylphosphate monomer is 37%.

Poly(4-hydroxystyrene) was treated as described above, except that di-isopropyl diethylphosphoramidite was used instead of the di-t-butylphosphoramidite. NMR showed nearly quantitative conversion of the hydroxy groups to di-isopropylphosphoryl groups. Thermal gravimetric analysis showed a weight loss of about 25 percent at 270° C. The theoretical loss due to the cleavage of the isopropyl groups from the polymer is 29 percent.

EXAMPLE 4

Poly(di-t-butyl vinylbenzylphosphonate) was prepared as described in Example 2. The polymer so prepared was dissolved in cyclopentanone; the resulting mixture was ten percent by weight polymer. The polymer solution was then spincoated at 2000 rpm for 2 minutes onto a silicon substrate. The substrate was divided into two pieces and one piece was heated to 180° C. for 10 minutes in a vacuum oven to deprotect the polymer on that substrate.

Both substrates were then immersed overnight in a 5 mM aqueous solution of zirconium oxychloride with a pH of 5. The substrates were then removed from the solution and washed with deionized water and spin dried. The substrates were then analyzed using X-Ray Photoelectron Spectroscopy (XPS) to determine the composition of the polymer on the surface of the two substrates. The polymer that was heated prior to immersion adsorbed 7.34 atom percent zirconium. The polymer that was not heated prior to immersion adsorbed 1.44 atom percent zirconium. Therefore, the zirconium binds preferentially to the deprotected polymer.

EXAMPLE 5

DEPOSITING METAL ON AN EXPOSED FILM CONTAINING THE POLYMERS OF THE PRESENT INVENTION

A poly(di-t-butyl vinylbenzylphosphonate) polymer was prepared as described in Example 2 above. The polymer was combined with ethyl 3-ethoxypropionate (10 wt. %) and a nitrobenzylsulfonate PAG (1 wt. %) to form a photoresist composition. The photoresist was then deposited on a substrate as in Example 4. The photoresist was patternwise exposed to radiation at 248 nm wavelength. The poly(di-t-butyl vinylbenzylphosphonate) polymer in the portion of the photoresist composition that was exposed to radiation was converted to phosphonic acid by PEB at 60° C. for about one minute in the presence of the acid generated by the exposure.

The patterned polymer film was sequentially immersed in three solutions for the electroless plating of nickel onto the exposed regions of the polymer film. The film was first immersed in an aqueous collodial suspension of tin (II) fluoride (0.017M; ultrasonicated 10 minutes) at room temperature for about 5 minutes. The film was then immersed in an aqueous palladium chloride solution (1.5 mM Pd $Cl_2$, 0.028 M HCl) at room temperature for about 5 minutes. Finally, the film was immersed in an electroless nickel bath at about 85° C. for about 1 minute. The electroless nickel bath was obtained from Fidelity Chemical Products Corp., electroless solution #4685, which was prepared and used according to the manufacturer's instructions.

The thickness of the nickel layer deposited on the exposed regions of the polymer was about 730 Å as measured using X-ray fluorescence. Only traces of nickel, i.e., a thickness of 13 Å as measured using X-ray fluorescence, was deposited on the unexposed portions of the polymer.

EXAMPLE 6

PREPARATION OF A RESIST POLYMER OF THE PRESENT INVENTION

A terpolymer of styrene, di-t-butyl vinylbenzylphosphonate and sulfur dioxide was prepared by polymerizing a feed composition of styrene monomer (0.15 mol), di-t-butyl vinylbenzylphosphonate (0.05 mol) and sulfur dioxide (0.5 mol) in toluene at 60° C. for 6.5 hours with an AIBN initiator. The polymer (10 wt. %) was combined with cyclohexanone and a nitrobenzylsulfonate PAG (3 wt. %) to form a photoresist composition. The photoresist was then deposited on a silicon substrate as described in Example 4. The coated substrate was then baked at 90° C. for 30 seconds. The photoresist was patternwise exposed to radiation with a 248 nm wavelength and then post exposure baked at a temperature of about 90° C. for about 3 minutes. The exposed film was developed using a solution that was 0.26N tetramethyl ammonium hydroxide in water. The resist had a clearing loss of 22mJ/$cm^2$ and a contrast of 7 based on an exposure response curve. The resist exhibited a 15 percent volume loss upon deprotection which was measured by comparing the thickness of the unexposed and exposed regions of the resist after PEB.

EXAMPLE 7

PREPARATION OF A RESIST POLYMER OF THE PRESENT INVENTION

A copolymer was prepared from a feed composition that contained equimolar amounts of di-isopropyl vinylbenzylphosphonate (50 mol %) and N-methylmaleimide (50 mol %) in cyclohexanone. Dodecane thiol was used as a chain transfer agent. The reaction temperature was 35° C. The resulting copolymer (10 wt. %) was combined with cyclohexanone and an onium salt PAG (15 wt. %) to form a photoresist composition. The photoresist was then deposited on a silicon substrate as described in previous Example 4. The coated substrate was then baked at 140° C. for 30 seconds. The photoresist was then patternwise exposed to radiation at 248 nm and then subjected to a PEB at 140° C for 1 minutes. The resist had a clearing loss of 47 mJ/$cm^2$ and a contrast of greater than 10. The resist also exhibited a 10% volume loss which was measured as described in Example 6.

EXAMPLE 8

INTRODUCTION OF A DYE INTO THE POLYMERS OF THE PRESENT INVENTION

Poly (di-isopropyl vinylbenzylphosphonate) was prepared as described in the above Example 2. The polymer was spin-coated onto a substrate and the substrate was cleaved in half. One portion of the substrate was placed on the surface of a hotplate at 275° C. for 1 minute in order to deprotect the polymer. The polymer on the other portion of the substrate was not thermally deprotected.

Both substrates were then immersed in an aqueous thionin (0.02 wt. %) solution for 5 minutes. The substrates were then removed from the solution, washed with water and spin dried. The substrate with the deprotected polymer thereon was a dark purple color, which evidenced dye absorption. The substrate with the protected polymer showed no evidence of dye adsorption.

We claim:

1. A process for fabricating a device comprising:

exposing a radiation sensitive region on a substrate to radiation to form an image of a pattern, developing the pattern and employing the pattern to define areas to the device, wherein the radiation sensitive material comprises a material including (1) a polymer that is the polymerization product of one or more monomers, wherein at least one of the monomers is selected from the group consisting of phosphonate ester monomers and phosphate ester monomers, and (2) a composition that results in generation of an acidic moiety as a result or irradiation with the radiation wherein the phosphonate ester moieties and the phosphate ester moieties convert to phosphorous acid moieties in the presence of the generated acidic moiety.

2. The process of claim 1 wherein the monomer has the general structure:

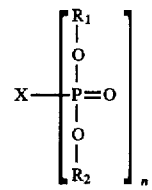

wherein $R_1$ is chosen such that the O—$R_1$ bond cleaves in the presence of acid to form a carbonium ion that is sufficiently stable to eliminate an available α-hydrogen and $R_2$ is the same or different from $R_1$ but is not hydrogen, n is an integer greater than or equal to one, and X is a polymerizable moiety containing ethylenic unsaturation.

3. The process of claim 2 wherein the polymerizable moiety containing ethylenic unsaturation is selected from the group consisting of vinyl, vinylbenzyl and vinylphenyl.

4. The process of claim 1 wherein the monomer has the general structure:

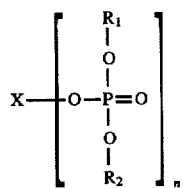

wherein $R_1$ is chosen such that the O—$R_1$ bond cleaves in the presence of acid to form a carbonium ion that is sufficiently stable to eliminate an available α-hydrogen and $R_2$ is the same or different from $R_1$ but is not hydrogen, n is an integer greater than or equal to one, and X is a polymerizable moiety containing ethylenic unsaturation.

5. The process of claim 4 wherein the polymerizable moiety containing ethylenic unsaturation is selected from the group consisting of vinyl, vinylbenzyl and vinylphenyl.

6. The process of claim 1 further comprising introducing an etch selectivity between the area of the radiation sensitive region exposed to radiation and the area of the radiation sensitive region not exposed to radiation by introducing a composition containing a refractory material onto the radiation sensitive region after the radiation sensitive region has been exposed to radiation and binding a greater amount of refractory material to the polymer in the exposed region than in the unexposed region.

7. The process of claim 1 further comprising introducing a color difference between the area of the radiation sensitive region exposed to radiation and the area of the radiation sensitive region not exposed to radiation by introducing a dye composition that is selectively incorporated onto and into polymers that are more acidic than the polymerization product, thereby incorporating a greater amount of the dye onto and into the polymerization product in the exposed region of the radiation sensitive region than in the unexposed region of the radiation sensitive region.

* * * * *